US009159373B2

(12) United States Patent
Nobunaga

(10) Patent No.: US 9,159,373 B2
(45) Date of Patent: Oct. 13, 2015

(54) ENHANCED BLOCK COPY

(71) Applicant: Micron Technology, Inc., Boise, ID (US)

(72) Inventor: Dean K. Nobunaga, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 13/938,039

(22) Filed: Jul. 9, 2013

(65) Prior Publication Data

US 2013/0304984 A1    Nov. 14, 2013

Related U.S. Application Data

(62) Division of application No. 12/512,765, filed on Jul. 30, 2009, now Pat. No. 8,484,428.

(51) Int. Cl.
| | |
|---|---|
| G11C 5/02 | (2006.01) |
| G06F 12/02 | (2006.01) |
| G11C 16/10 | (2006.01) |
| G11C 19/00 | (2006.01) |
| G11C 16/04 | (2006.01) |

(52) U.S. Cl.
CPC ............ *G11C 5/025* (2013.01); *G06F 12/0246* (2013.01); *G11C 16/105* (2013.01); *G11C 19/00* (2013.01); *G06F 2212/7203* (2013.01); *G11C 16/0483* (2013.01)

(58) Field of Classification Search
CPC ..... G06F 3/0647; G06F 3/067; G06F 3/0605; G06F 11/2082; G06F 3/065; G06F 11/1451; G06F 11/1469; G06F 12/0868; G06F 11/1458; G06F 11/1008; G06F 13/28; G11C 26/765; H01L 2924/00
See application file for complete search history.

(56) References Cited

U.S. PATENT DOCUMENTS

| | | | |
|---|---|---|---|
| 6,304,510 B1 | 10/2001 | Nobunaga et al. | |
| 6,307,790 B1 | 10/2001 | Roohparvar et al. | |
| 6,310,809 B1 | 10/2001 | Roohparvar et al. | |
| 6,496,434 B1 | 12/2002 | Nobunaga | |
| 6,507,525 B1 | 1/2003 | Nobunaga et al. | |
| 6,584,025 B2 | 6/2003 | Roohparvar et al. | |
| 6,594,183 B1 * | 7/2003 | Lofgren et al. .......... | 365/185.33 |

(Continued)

FOREIGN PATENT DOCUMENTS

KR    1020080084024    9/2008

OTHER PUBLICATIONS

Office Action from related Taiwan patent application No. 099125169, dated May 22, 2014, 15 pp.

(Continued)

*Primary Examiner* — J. H. Hur
*Assistant Examiner* — Ajay Ojha
(74) *Attorney, Agent, or Firm* — Brooks, Cameron & Huebsch, PLLC

(57) ABSTRACT

Methods and apparatuses for an enhanced block copy. One embodiment is reading data from a source block located in a first portion of the memory device, and programming the data to a target block located in a second portion of the memory device. The first and second portions are communicatively coupled by data lines extending across the portions. The data lines are communicatively uncoupled between the first and second portions for at least one of the reading and programming acts.

19 Claims, 10 Drawing Sheets

(56) References Cited

U.S. PATENT DOCUMENTS

| | | | |
|---|---|---|---|
| 6,678,201 | B2 | 1/2004 | Roohparvar et al. |
| 6,693,841 | B2 | 2/2004 | Roohparvar et al. |
| 6,877,100 | B1 | 4/2005 | Nobunaga et al. |
| 7,080,275 | B2 | 7/2006 | Abedifard et al. |
| 7,130,227 | B2 | 10/2006 | Nobunaga et al. |
| 7,193,910 | B2 | 3/2007 | Nobunaga et al. |
| 7,231,537 | B2 | 6/2007 | Nobunaga |
| 7,272,694 | B2 | 9/2007 | De Santis et al. |
| 7,280,398 | B1 | 10/2007 | Lee |
| 7,292,487 | B1 | 11/2007 | Gatzemeier et al. |
| 7,480,195 | B2 | 1/2009 | Nobunaga et al. |
| 7,672,160 | B2 | 3/2010 | Park et al. |
| 8,145,866 | B2 | 3/2012 | Lee |
| 2004/0170056 | A1* | 9/2004 | Shibata et al. ............ 365/185.03 |
| 2005/0172086 | A1 | 8/2005 | Kawai |
| 2005/0249026 | A1* | 11/2005 | Shin .............................. 365/233 |
| 2005/0265060 | A1 | 12/2005 | Nobunaga et al. |
| 2006/0168414 | A1 | 7/2006 | Nobunaga et al. |
| 2006/0248368 | A1 | 11/2006 | Nobunaga et al. |
| 2007/0002621 | A1 | 1/2007 | Park |
| 2007/0143677 | A1* | 6/2007 | Pyeon et al. .................. 715/700 |
| 2008/0123423 | A1* | 5/2008 | Kim ......................... 365/185.11 |
| 2008/0177933 | A1 | 7/2008 | Nobunaga et al. |
| 2008/0181014 | A1 | 7/2008 | Lee |
| 2008/0313387 | A1* | 12/2008 | Shibata ......................... 711/103 |
| 2009/0116301 | A1 | 5/2009 | Nobunaga et al. |

OTHER PUBLICATIONS

International Search Report and Written Opinion for related PCT Application PCT/US2010/002008, mailed Feb. 21, 2011, 9 pages.

Takeuchi, Ken, et al. "A 56nm CMOS 99mm2 8Gb Multi-level NAND Flash Memory with 10MB/s Program Throughput." IEEE ISSCC 2006, Feb. 6-9, 2006, pp. 507-516.

Cooke, Jim, Flash Memory 101: An introduction to NAND flash, Mobile Handset Designline, Mar. 20, 2006, www.mobilehandsetdesignline.com. (accessed May 5, 2008).

Cooke, Jim, Flash Memory Technology Direction, Microsoft WinHEC Conference 2007, May 2, 2007.

Micron Technology, Inc., Technical Note 29-25: Improving NAND Flash Performance Using Two-Plane Command Enabled Micron Devices, Jun. 2007.

Micron Technology, Inc., Technical Note 29-14: NAND Flash Performance Increase with Program Page Cache Mode Command, May 2007.

Micron Technology, Inc., Technical Note 29-01: NAND Flash Performance Using the Micron Page Read Cache Mode Command, May 2007.

Micron Technology, Inc., Technical Note 29-26: NAND Flash Status Register Response in Cache Programming Operations, 2007.

ST Microelectronics, Application Note 1727: How to Use the Cache Program Feature of NAND Flash Memories, May 2004.

Notice of Decision of Rejection from related Taiwan Patent Application No. 099125169, dated May 21, 2015, 7 pp.

* cited by examiner

ENHANCED BLOCK COPY

PRIORITY APPLICATION INFORMATION

This application is a Divisional of U.S. application Ser. No. 12/512,765, filed Jul. 30, 2009, the specification of which is incorporated herein by reference.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Data, such as program code, user data and/or system data, such as a basic input/output system (BIOS), are typically stored in flash memory devices. This data can be used in personal computer systems, among others.

Two common types of flash memory array architectures are the "NAND" and "NOR" architectures, so called for the logical form in which the basic memory cell configuration of each is arranged.

A NAND array architecture arranges its array of memory cells in a matrix such that the control gates of each memory cell in a "row" of the array are coupled to (and in some cases, form) an access line, which is commonly referred to in the art as a "word line". However each memory cell is not directly coupled to a data line, which is commonly referred to as a digit line (e.g., a bit line) in the art, by its drain. Instead, the memory cells of the array are coupled together in series, source to drain, between a common source line and a data line, where the memory cells commonly coupled to a particular data line are referred to as a "column".

Memory cells in a NAND array architecture can be programmed to a desired state. For example, electric charge can be placed on or removed from a charge storage node (e.g., a floating gate) to put the cell into one of a number of programmed states. For example, a single level cell (SLC) can represent two states (e.g., 1 or 0). Flash memory cells can also store more than two states (e.g., 1111, 0111, 0011, 1011, 1001, 0001, 0101, 1101, 1100, 0100, 0000, 1000, 1010, 0010, 0110, and 1110). Such cells may be referred to as multilevel cells (MLCs). MLCs can allow the manufacture of higher density memories without increasing the number of memory cells since each cell can represent more than one digit (e.g., more than one bit). For example, a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than, for example, having a charge applied to the cell during a programming operation. The other fifteen states can be referred to as "non-erased" states.

Flash memory devices can be programmed with various amounts of data at one time. The amount of data programmable at one time can be referred to as a page of data (wherein the cells storing the page of data can be referred to as a page of memory cells). In some memory devices, one page of data includes data stored on memory cells coupled to a given access line (which may be one and the same as the conductor that forms the control gate of the cell). In other memory devices, data stored in memory cells coupled to an access line can be divided into more than one page (e.g., into an "even" page and "odd" page of data). In some instances, a page of data may include data stored in memory cells coupled to more than one access line. Various amounts of data can also be erased from a flash device at the same time. The amount of data erasable at one time can be referred to as a block of data (wherein the cells corresponding to the block of data can be referred to as a block of memory cells). A block of data can include a number of data pages. A memory plane can include a number of data blocks on a given die (wherein a plane can therefore also refer to the memory cells that correspond to the data blocks). Some memory devices have multiple planes per die. For example, a die could include a plane of "even" numbered blocks and a plane of "odd" numbered blocks.

Block copy is an operation performed to move data stored in memory from one block location to another block location. For example, block copy may be done as part of memory wear leveling operations. The time to perform a block copy (e.g., Block Copy time) is usually defined by a FLASH memory specification which describes the amount of time utilized to transfer the entire data contents from one block to another block. Block Copy time may also be referred to Block Write Access Time in SD Card specifications.

Block copy time is primarily a function of the quantity of pages in the block, the page program time, and the time utilized to input and output data from the page.

DETAILED DESCRIPTION

Figure 1:
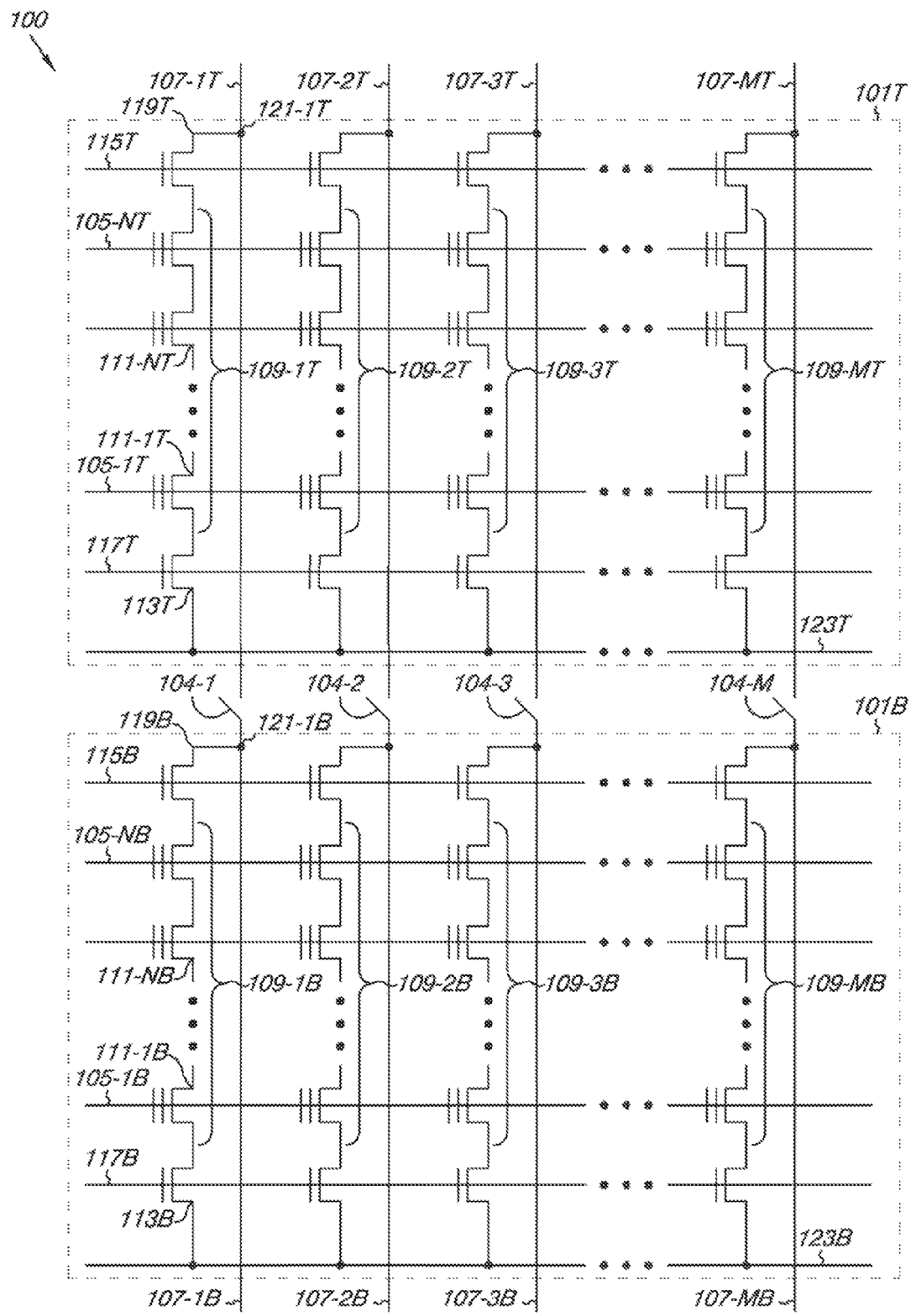
FIG. 1 is a schematic of a portion of a non-volatile memory array in accordance with one or more embodiments of the present disclosure.

The present disclosure includes methods and apparatus for an enhanced block copy. One embodiment includes reading data from a source block located in a first portion of the memory device, and programming the data to a target block located in a second portion of the memory device. The first and second portions are communicatively coupled by data lines (e.g., bit lines) extending across the portions. The data lines are communicatively uncoupled between the first and second portions for at least one of the reading and programming acts.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M," "N," "X, and "Y," particularly with respect to reference numerals in the drawings, indicate that a number of the particular feature so designated can be included with one or more embodiments of the present disclosure.

Block copy time is primarily a function of the quantity of pages in the block, the page program time, and the time utilized to input and output data from the page. In previous approaches, more recently developed NAND FLASH memory utilizing an All Bit Line (ABL) architecture have had significantly better Block Copy times over previous NAND FLASH memory utilizing a Shielded Bit Line (SBL) architecture, since with ABL architecture all bit lines (both even and odd bit lines) are accessed simultaneously while with SBL architecture only alternate (e.g., even or odd) bit lines are accessed at a time. Thus, NAND FLASH devices utilizing an ABL architecture can achieve approximately twice the performance in page program and page read performance as compared to NAND FLASH devices utilizing an SBL architecture.

One or more embodiments for operating a NAND FLASH memory having an SBL architecture include providing more than one edge page buffer (e.g., sets of dynamic data cache (DDC)). Generally, one set of DDC is used for inputting and outputting data (e.g., I/O DDC) and another set of DDC is used for programming (e.g., Write DDC). Overall Block Copy time can then be improved over previous operating methods by programming data from the Write DDC substantially concurrently with outputting and inputting data through the I/O DDC.

According to one or more embodiments of the present disclosure, further Block Copy performance advantages can be realized by configuring the memory array into multiple memory portions, and configuring the bit line architecture to have a switching device (e.g., a switch) between the multiple memory portions. Arranging multiple DDCs such that a first DDC is associated with a first memory portion, and a second DDC is associated with a second memory portion permits the memory portions to be operated independently. Page programming and page read times can then be further improved by opening the bit line switch, for example, thereby reducing bit line length for certain operations of each respective memory portion, which reduces the RC time constant, and associated charging times and power.

FIG. 1 is a schematic of a portion of a non-volatile memory array in accordance with one or more embodiments of the present disclosure. The embodiment of FIG. 1 illustrates a NAND architecture non-volatile memory; however, embodiments described herein are not limited to this example. As shown in FIG. 1, the memory array 100 includes a top portion 101T and a bottom portion 101B, with a switching device (e.g., switch, transistor, 1:1 multiplexor, pass gate) 104-1, 104-2, 104-3, . . . 104-M, located in each respective bit line between the top and bottom memory portions.

The top 101T memory portion includes access lines 105-1T, 105-NT and a top portion of data lines 107-1T, . . . , 107-MT (e.g., a top portion of bit lines). The bottom 101B memory portion includes access lines 105-1B, . . . , 105-NB and a bottom portion of data lines 107-1B, . . . , 107-MB (e.g., a bottom portion of bit lines). As the reader will appreciate, particular features are labeled in FIG. 1 with an additional reference character (e.g., "T" to indicate association with the top memory portion 101T, or "B" to indicate association with the bottom memory portion 101B); however, to simplify the discussion herein, only the common reference characters will be used to indicate a particular feature that applies to each respective memory portion. For ease of addressing in the digital environment, the number of access lines and the number of data lines can be each some power of two (e.g., 256 access lines by 4,096 data lines).

Memory array 100 includes NAND strings 109-1, . . . , 109-M. Each NAND string includes non-volatile memory cells 111-1, . . . , 111-N, each communicatively coupled to a respective access line 105-1, . . . , 105-N and a local data line 107-1, . . . , 107-M. The non-volatile memory cells 111-1, . . . , 111-N of each NAND string 109-1, . . . , 109-M are connected in series source to drain between a source select gate (SGS) (e.g., a field-effect transistor (FET) 113) and a drain select gate (SGD) (e.g., FET 119). Each source select gate 113 is configured to selectively couple a respective NAND string 109 to a common source 123 responsive to a signal on source select line 117, while each drain select gate 119 is configured to selectively couple a respective NAND string to a respective data line (e.g., 107-1) responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the data line (e.g., 107-1) of the corresponding NAND string 109-1 at drain contact 121-1. The source of drain select gate 119 is connected to the drain of the last memory cell 111-N (e.g., a floating-gate transistor) of the corresponding NAND string 109-1.

In one or more embodiments, construction of non-volatile memory cells, 111-1, . . . , 111-N, includes a source, a drain, a floating gate or other charge storage node, for example, and a control gate. Non-volatile memory cells, 111-1, . . . , 111-N, have their control gates coupled to an access line, 105-1, . . . , 105-N respectively. A column of the non-volatile memory cells, 111-1, . . . , 111-N, make up the NAND strings (e.g., 109-1, . . . , 109-M) and are coupled to a given data line (e.g., 107-1, . . . , 107-M) respectively. A row of the non-volatile memory cells are those memory cells commonly coupled to a given access line (e.g., 105-1, . . . , 105-N). A NOR array architecture would be similarly laid out except that the string of memory cells would be coupled in parallel between the select gates.

As one of ordinary skill in the art will appreciate, subsets of cells coupled to a selected access line (e.g., 105-1, . . . , 105-N) can be programmed and/or sensed together as a group. A programming operation (e.g., a write operation) can include applying a number of program pulses (e.g., 16V-20V) to a selected access line in order to increase the threshold voltage (Vt) of selected cells coupled to that selected access line to a desired program voltage level corresponding to a desired program state.

A sensing operation, such as a read or program verify operation, can include sensing a voltage and/or current change of a data line coupled to a selected cell in order to determine the state of the selected cell. The sensing operation can involve biasing a data line (e.g., data line 107-1) associated with a selected memory cell at a voltage above a bias voltage for a source line (e.g., source line 123) associated with the selected memory cell. A sensing operation could alternatively include precharging the data line 107-1 followed with discharge when a selected cell begins to conduct, and sensing the discharge, among other sensing operations.

Sensing the state of a selected cell can include applying a sensing voltage to a selected access line, while biasing the access lines coupled to the unselected cells of the string at a voltage sufficient to place the unselected cells in a conducting state independent of the threshold voltage of the unselected cells. The data line corresponding to the selected cell being read and/or verified can be sensed to determine whether or not the selected cell conducts in response to the particular sensing voltage applied to the selected access line. For example, the state of a selected cell can be determined by the access line voltage at which the data line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the data line corresponding to the string. For instance, data stored in the selected cell can be based on whether the data line current changes by a particular amount or reaches a particular level in a given time period.

When the selected cell is in a conductive state, current flows between the source line contact at one end of the string and a data line contact at the other end of the string. As such, the current associated with sensing the selected cell is carried through each of the other cells in the string, the diffused regions between cell stacks, and the select transistors.

Figure 2A:
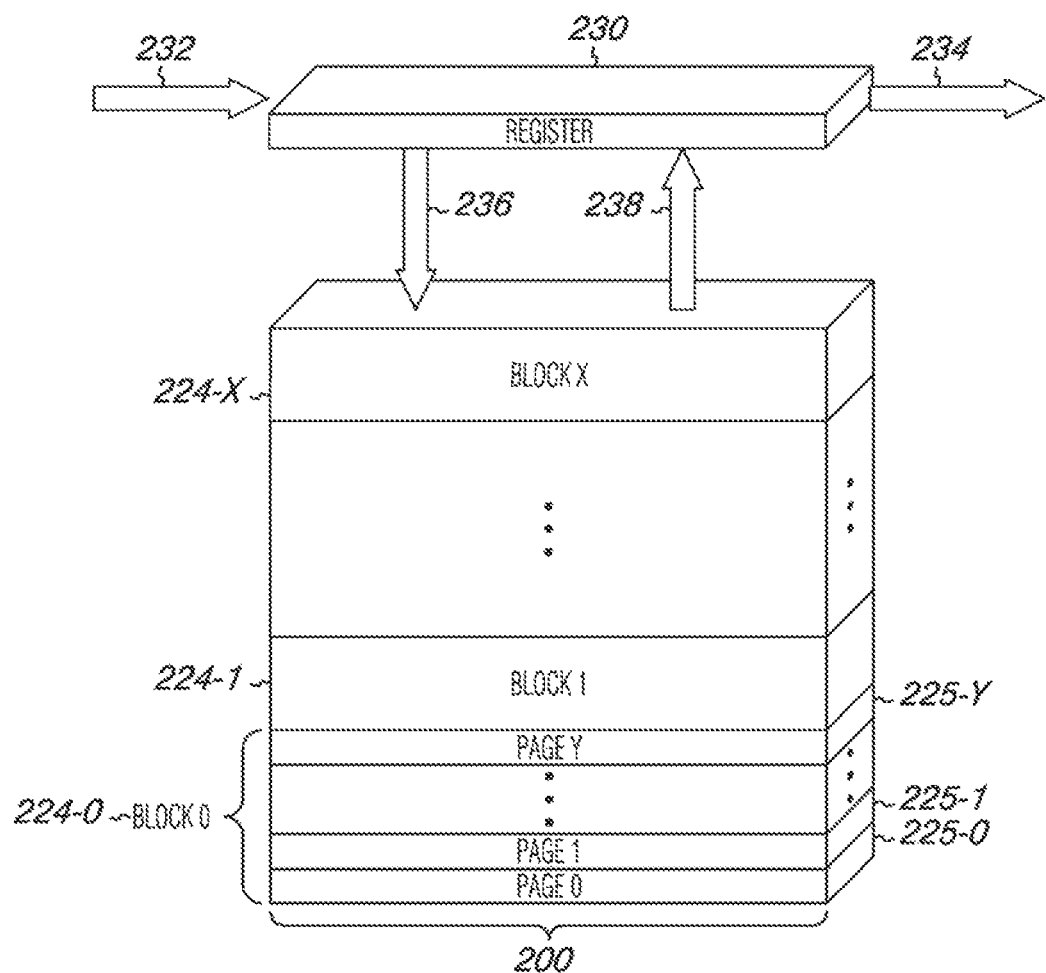
FIG. 2A illustrates a block diagram of a memory device in accordance with one or more embodiments of the present disclosure.

FIG. 2A illustrates a block diagram of a memory device in accordance with one or more embodiments of the present disclosure. The embodiment of FIG. 2A illustrates memory plane 200 having a number of pages, 225-0, 225-1, . . . , 225-Y, included in Block 0, 224-0. FIG. 2A also illustrates a number of other blocks 224-1, . . . 224-X. According to the embodiment illustrated in FIG. 2A, blocks 224-0, 224-1, . . . 224-X are included in memory plane 200.

As an example, a 2 GB memory device can include 2112 bytes of data per page, 64 pages per block, and 2048 blocks per plane. SLC devices store one bit per cell. MLC devices can store multiple bits per cell (e.g., 2 bits per cell). In a binary system, a "bit" represents one unit of data. As embodiments are not limited to a binary system, the smallest data element may be referred to herein as a "digit."

Memory plane 200 is shown in bidirectional communication with register 230 at 236 and 238. As one of ordinary skill in the art will appreciate, data can be transferred from register 230 to the memory plane 200 at 236 during programming operations. Data can also be transferred from the memory plane 200 to the register 230 at 238 during sensing operations. Register 230 can communicate data to input/output (I/O) circuitry (e.g., 695 in FIG. 6) at 234 and can receive data from I/O circuitry at 232. Register 230 can communicate data with I/O circuitry through a number of data cycles. By way of example, a page of data (e.g., 2 kilobytes (kB) of data) can be loaded into register 230 through a number of 1 byte data cycles. Embodiments are not limited to memory devices including a 2 kB page size. Other page sizes can be used with embodiments of the present disclosure (e.g., 4 kB, 8 kB, etc.) As the reader will appreciate, a partial page of data can be communicated to and/or from register 230.

Figure 2B:
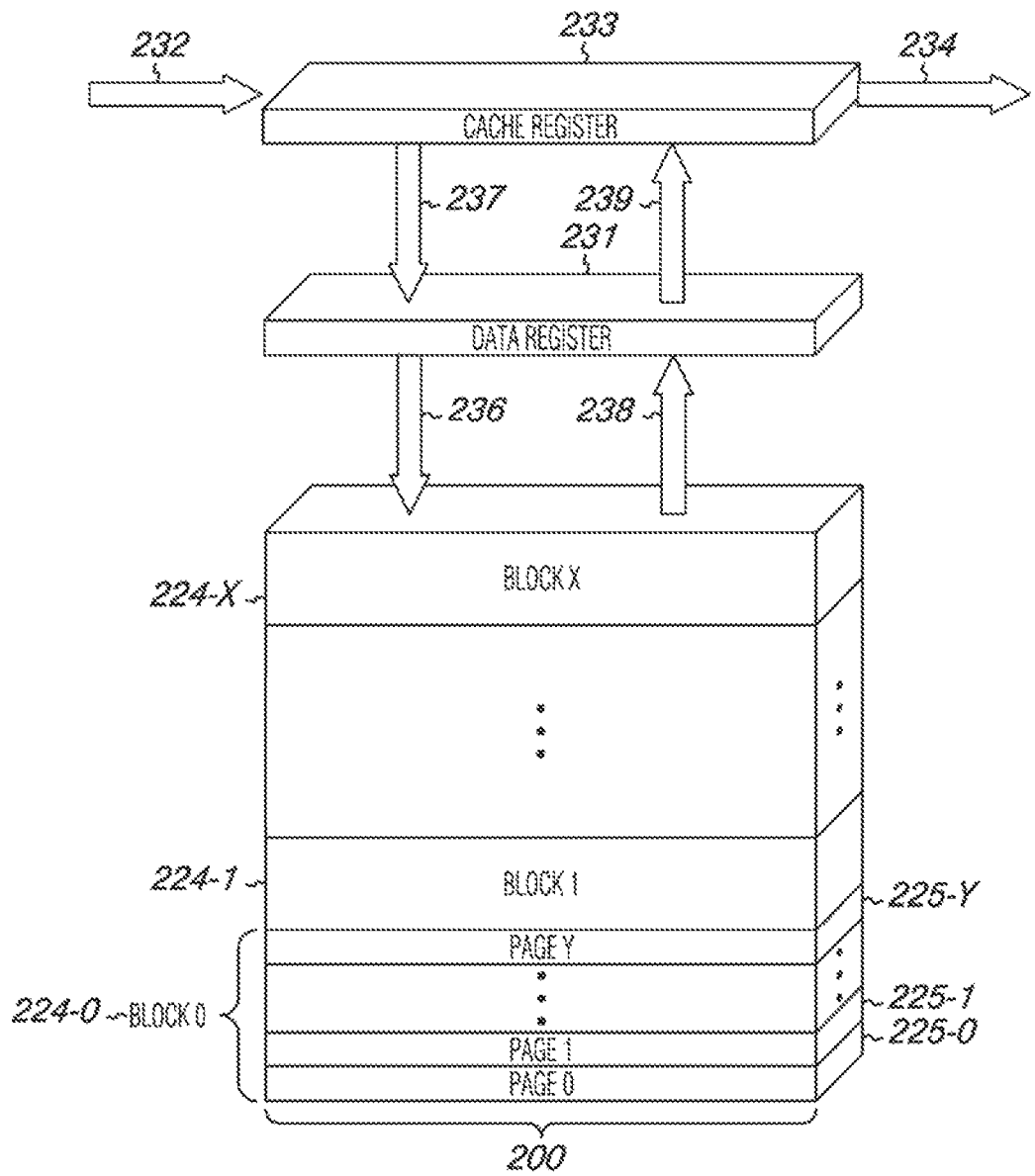
FIG. 2B illustrates a block diagram of a memory device in accordance with one or more embodiments of the present disclosure.

FIG. 2B illustrates a block diagram of a memory device in accordance with one or more embodiments of the present disclosure. Analogous to FIG. 2A, the embodiment of FIG. 2B illustrates a number of pages (e.g., Page 0) 225-0, and blocks (e.g., Block 0) 224-0, in memory plane 200. However, unlike FIG. 2A, the memory plane 200 in FIG. 2B is associated with two registers, data register 231 and cache register 233. Data register 231 can operate in an analogous fashion to register 230 in FIG. 2A in that it can transfer 236 data to memory plane 200 and receive 238 data from the memory plane 200. Cache register 233 can operate in an analogous fashion to register 230 in FIG. 2A in that it can communicate data to and/or from I/O circuitry through a number of data cycles (e.g., data input cycles 232 or data output cycles 234).

During non-cache operations, the data register 231 and cache register 233 can operate together as a single register (e.g., as register 230 in FIG. 2A). During cache operations, data register 231 and cache register 233 can operate separately in a pipelined process. For example, during a program operation, data from I/O circuitry (e.g., from a host, from a processor associated with the host) can be loaded 232 into the cache register (e.g., through a number of serially clocked data cycles) and then transferred 237 from the cache register to the data register. After data is transferred to the data register, the contents of the data register can be programmed into memory plane 200 as illustrated at 236. In an example read operation, data can be read from memory plane 200 into data register 231 as illustrated at 238. After data is loaded into data register 231, it can be transferred 239 to cache register 233. After data has been loaded into cache register 233, it can be transferred 234 out to I/O circuitry.

Figure 3:
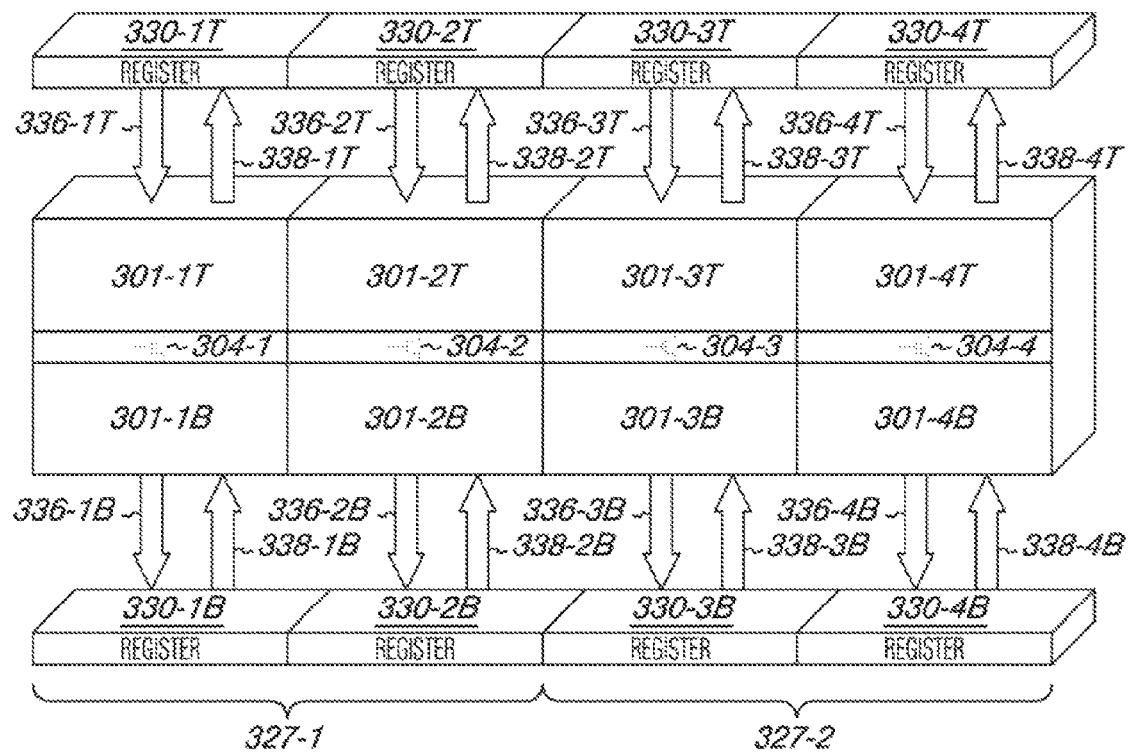
FIG. 3 illustrates a block diagram of a memory device in accordance with one or more embodiments of the present disclosure.

FIG. 3 illustrates a block diagram of a memory device in accordance with one or more embodiments of the present disclosure. The memory device shown in FIG. 3 includes two memory dies 327-1 and 327-2 with two planes each, where each plane has a first (e.g., top) portion 301-1T, 301-2T, 301-3T, and 301-4T, and a second (e.g., bottom) portion 301-1B, 301-2B, 301-3B, and 301-4B. Similar to the detail illustrated in FIG. 1, the respective bit line portions, that extend across the top and bottom portions of each memory plane, can be coupled through respective switching device (e.g., bit line pass gate) 304-1, 304-2, 304-3, and 304-4. While a particular type of switching device (e.g., a single transistor) is shown for simplicity to represent the bit line pass gates in the figures, one having ordinary skill in the art will appreciate that each bit line may have other types of a switching device configured to interrupt a respective bit line.

As each die has two planes, and each plane is configured to have two portions, the reader will appreciate the die thus having a quad plane mode when the bit line pass gates are open (e.g., non-conducting), and a dual plane mode when the bit line pass gates are closed (e.g., conducting). Thus, the bit line pass gates may also be equivalently referred to as quad plane switches.

Each portion of a plane is in bidirectional communication with a register such as an edge page buffer (DDC) respectively 330-1T, 330-1B, 330-2T, 330-2B 330-3T, 330-3B, 330-4T, and 330-4B, as indicated in FIG. 3 by arrows 336-1T, 336-1B, 338-1T, 338-1B, 336-2T, 336-2B, 338-2T, 338-2B, 336-3T, 336-3B, 338-3T, 338-3B, 336-4T, 336-4B, 338-4T, and 338-4B respectively. While each DDC is shown for simplicity as a "register" in FIG. 3, the register may be implemented as shown in FIG. 2A by 230, or by multiple registers as shown in FIG. 2B by data register 231 and cache register 233, for example. Each register can function substantially as described above with respect to FIGS. 2A and/or 2B.

In the embodiment illustrated in FIG. 3, plane 301-1 includes portions 301-1T and 301-1B, and can represent half of the blocks on die 327-1, while plane 301-2 includes portions 301-2T and 301-2B, and can represent the other half. Plane 301-3 includes portions 301-3T and 301-3B, and can represent half of the blocks on die 327-2, while plane 301-4 includes portions 301-4T and 301-4B, and can represent the other half.

When the quad switches 304-1, 304-2, 304-3 and 304-4 are open, the top registers (e.g., DDC) 330-1T, 330-2T, 330-3T and 330-4T are in communication with, and servicing, the corresponding top portion of each respective plane 301-1T, 301-2T, 301-3T and 301-4T. The bottom registers (e.g., DDC) 330-1B, 330-2B, 330-3B and 330-4B are in communication with, and servicing, the corresponding bottom portion of each respective plane 301-1B, 301-2B, 301-3B and 301-4B. When the quad switches 304-1, 304-2, 304-3 and 304-4 are closed, the top and bottom registers (e.g., DDC) 330-1T, 330-1B, 330-2T, 330-2B, 330-3T, 330-3B, 330-4T, and 330-4B are in communication with and servicing the entire corresponding plane 301-1, 301-2, 301-3 and 301-4 (e.g., both top and bottom portions).

In one or more embodiments, planes 301-1 and 301-3 may be referred to as plane 0 of each respective die, and planes 301-2 and 301-4 may be referred to as plane 1 of each respective die. In one or more embodiments, planes can be divided between odd and even numbered blocks. In one or more embodiments, an "odd" or "even" block of data can be a logical representation of data where data units from half (the "odd" numbered) of the memory cells coupled to access lines associated with the block are stored in an "odd" block and data units from the other half (the "even" numbered) of the memory cells coupled to access lines associated with the block are stored in an "even" block. Embodiments are not limited to a particular plane representing half of the blocks on a given die having more than one plane; other distributions of blocks between planes are possible. Nor are embodiments limited to memory devices with a particular number of blocks, planes, or dice.

Figure 4:
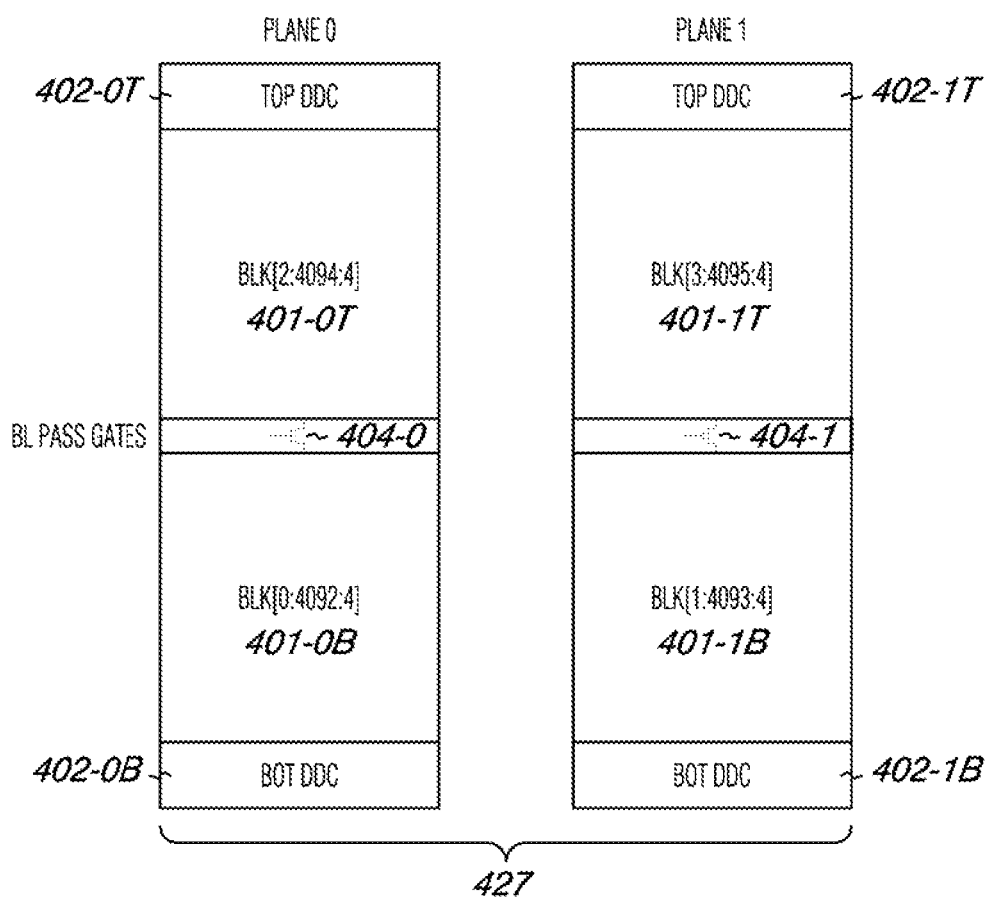
FIG. 4 illustrates a block diagram of an enhanced dual plane memory device in accordance with one or more embodiments of the present disclosure.

FIG. 4 illustrates a block diagram of a enhanced dual plane memory device in accordance with one or more embodiments of the present disclosure. The memory device 427 illustrated in FIG. 4 includes two planes, shown as plane 0 and plane 1. Plane 0 has a first (e.g., top) portion 401-0T and a bottom portion 401-0B. Plane 1 also has a first (e.g., top) portion 401-1T and a bottom portion 401-1B. Each of the portions have a dynamic data cache (DDC) located proximate thereto and associated therewith. For convenience of illustration in the figures, the portions are indicated to be a top and bottom portion, and the associated DDCs are indicated to be a top and bottom DDC respectively. However, embodiments of the present invention are not so limited. That is, DDCs need not be located at any particular geographic orientation with respect to the memory cells or other DDC, and may be located differently than shown in the figures (e.g., non-adjacent). The terms "top" and "bottom" are used for convenience in referring to particular features, as to distinguish them from other particular features, in this disclosure.

For example, top DDC 402-0T is associated with the top portion 401-0T of Plane 0; bottom DDC 402-0B is associated with the bottom portion 401-0B of Plane 0; top DDC 402-1T is associated with the top portion 401-1T of Plane 1; and bottom DDC 402-1B is associated with the bottom portion 401-1B of Plane 1. Similar to the detail illustrated in FIG. 1, bit lines extend across top and bottom portions of each plane. Portions of each bit line are coupled together through a bit line pass gate (e.g., 104-1, 104-2, 104-3, and 104-4, as shown in FIG. 1).

While a single transistor symbol is shown in the figures to represent the bit line pass gates, the bit line pass gates are not so limited and can be implemented by any suitable switching device (e.g., circuitry), including but not limited to, a transistor, a multiplexer, or other controllable switching devices. Each bit line has one, or more, bit line pass gate(s) therein. Each of a number of bit line (BL) pass gates (e.g., 404-0, 404-1) are configured to interrupt a corresponding bit line extending across the respective portions (e.g., top and bottom). Embodiments of the present disclosure are not limited to a single bit line pass gate in a particular bit line, for example, one or more bit lines can have multiple bit line pass gates therein, partitioning the respective bit line into more than two portions. Furthermore, the bit line pass gate are not restricted to partitioning the respective bit line into equal portions.

FIGS. 5A-5D illustrate an enhanced block copy from one location in a memory plane to another location in the memory plane in accordance with one or more embodiments of the present disclosure. Plane 0, shown in FIGS. 5A-5D, includes a top portion 501-0T, a bottom portion 501-0B with bit line (BL) pass gates 504-0 coupling respective portions of bit lines that extend across the portions. Plane 0 further includes a top DDC 502-0T and a bottom DDC 502-0B, each communicatively coupled to their corresponding portions (e.g., top DDC 502-0T being communicatively coupled to the top portion 501-0T of plane 0, and bottom DDC 502-0B being communicatively coupled to the bottom portion 501-0B of plane 0). Plane 0, including its component parts and features, can function substantially as described above with respect to FIG. 4.

Figure 5A:
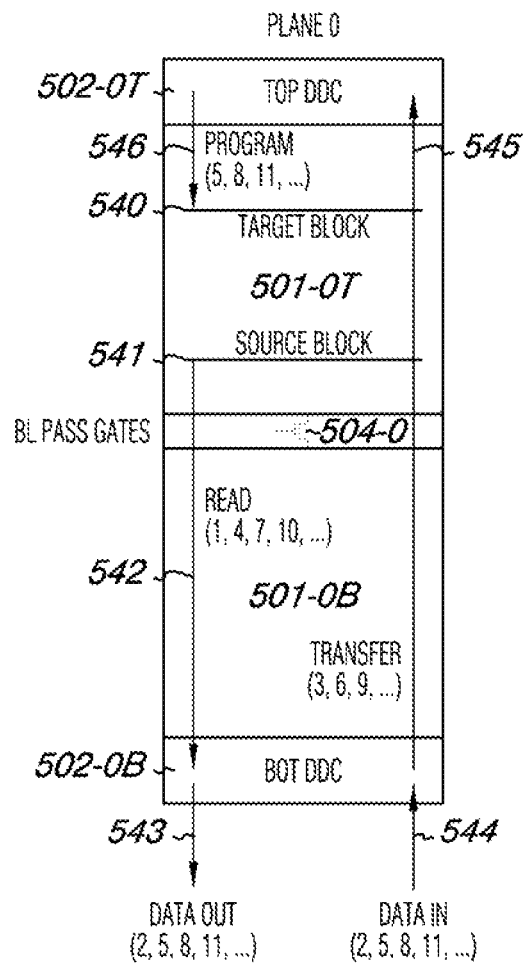
FIG. 5A illustrates a block diagram of an enhanced block copy from a top portion of a plane to the top portion of the plane in accordance with one or more embodiments of the present disclosure.

FIG. 5A illustrates a block diagram of an enhanced block copy from a top portion of a plane to the top portion of the plane in accordance with one or more embodiments of the present disclosure. FIG. 5A illustrates the source block 541 and the target block 540 being both located in the top portion 501-0T of plane 0. Copying a block of data from a first (source) block to another (target) block often involves moving (e.g., reading and programming) data in quantities that are less than all data of an entire block (e.g., one page at a time). For purposes of this discussion, data will be operated upon one page at a time; however, embodiments of the present disclosure are not so limited, and may involve operations on quantities of data that consist of more, or lesser, amounts of data.

First (e.g., step 1), page 0 data is read from the source block 541 to the bottom DDC 502-0B as indicated at 542. The page of data is communicated through the bit lines, and so the bit line pass gates 504-0 are on to enable the above-mentioned operation. Next (e.g., step 2), the Page 0 data is output from the bottom DDC 502-0B (e.g., to perform any error-checking and data scrubbing techniques) as indicated at 543, and input back to the bottom DDC 502-0B as indicated at 544. Next (e.g., step 3), the Page 0 data is transferred from the bottom DDC 502-0B to the top DDC 502-0T, as indicated at 545. Again, the bit line pass gates 504-0 are on to enable the transfer operation.

At step 4, page 1 data is read from the source block 541 to the bottom DDC 502-0B as indicated at 542 for step 4. As was the case for the Page 0 data, the Page 1 data is communicated through the bit lines, thus the bit line pass gates 504-0 are on to enable the above-mentioned read operation from the top portion 501-0T of plane 0 to the bottom DDC 502-0B. At this point, Page 0 data is located in the top DDC 502-0T and Page 1 data is located in the bottom DDC 502-0B.

At step 5, Page 0 data is programmed (e.g., written) from the top DDC 502-0T to the target block 540 (e.g., Page 0 of the target block). Substantially concurrently with the above-mentioned programming operation, Page 1 data is output from the bottom DDC 502-0B (e.g., to perform any error-checking and data scrubbing techniques) as indicated at 543 for step 5, and input back to the bottom DDC 502-0B as indicated at 544 for step 5. As no data is communicated through the bit line pass gates 504-0 during either operation of step 5, the bit line pass gates are controlled to interrupt respective bit lines while the Page 0 data is being programmed to the target block 540. Opening the bit line pass gates 504-0 reduces the length of the bit lines (e.g., by approximately one half) thereby reducing their RC characteristics, and reducing the corresponding bit line charging time. That is, changing the state of certain bit lines can thus be completed faster, making programming Page 0 to the target block 540 faster as well.

The bit line pass gates are thereafter closed, and at step 6 the Page 1 data is transferred from the bottom DDC 502-0B to the top DDC 502-0T, as indicated at 545 for step 6. At step 7, page 2 data is read from the source block 541 to the bottom DDC 502-0B as indicated at 542 for step 7. As was the case for the Page 0 and Page 1 data, the Page 2 data is communicated through the bit lines, thus the bit line pass gates 504-0 are on to enable the above-mentioned read operation from the source block 541 in the top portion 501-0T of plane 0 to the bottom DDC 502-0B. At this point, Page 1 data is located in the top DDC 502-0T and Page 2 data is located in the bottom DDC 502-0B.

The reader will appreciate that the above-described cyclical process continues until all pages have been moved from the source block 541 to the target block 540. The one or more above-described method embodiments of the present disclosure are comparable or faster than previous block copy methods for ABL architectures. Although one skilled in the art will recognize that an additional transfer step is included (e.g., step 5 transferring data from one DDC to the other), except for the first transfer (e.g., step 2) this step is performed substantially concurrently with a programming step (e.g., at step 5 as described above). An overall operation time improvement is attributable to the faster read and programming times due to the shorter bit line length achieved by opening the bit line pass gates 504-0 during some read and program operations (depending on location of the source and target blocks, as will become apparent by the discussions of FIGS. 5B-5D herein).

Figure 5B:
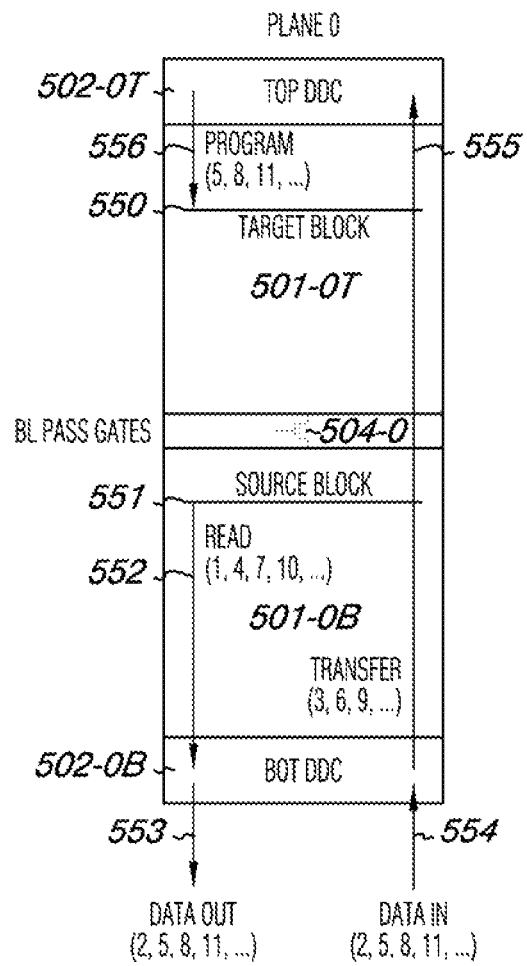
FIG. 5B illustrates a block diagram of an enhanced block copy from a bottom portion of a plane to a top portion of the plane in accordance with one or more embodiments of the present disclosure.

FIG. 5B illustrates a block diagram of an enhanced block copy from a bottom portion of a plane to a top portion of the plane in accordance with one or more embodiments of the present disclosure where the source block 551 is located in the bottom portion 501-0B of plane 0 and the target block 550 is located in the top portion 501-0T of plane 0. In a similar series of cyclical data move operations to those described with respect to FIG. 5A, first (e.g., step 1), page 0 data is read from the source block 551 to the bottom DDC 502-0B as indicated at 552. However, the Page 0 data does not have to pass through the bit line pass gates 504-0 in being communicated by the bit lines from the bottom portion 501-0B of plane 0, so the bit line pass gates 504-0 are open to reduce the bit line length during this read operation.

Next (e.g., step 2), the Page 0 data is output from the bottom DDC 502-0B (e.g., to perform any error-checking and data scrubbing techniques) as indicated at 553, and input back to the bottom DDC 502-0B as indicated at 554. Next (e.g., step 3), the Page 0 data is transferred from the bottom DDC 502-0B to the top DDC 502-0T, as indicated at 555. Again, the bit line pass gates 504-0 are controlled to enable the transfer operation between top and bottom DDCs.

At step 4, page 1 data is read from the source block 551 to the bottom DDC 502-0B as indicated at 552 for step 4. As was the case for the Page 0 data, the Page 1 data is communicated through the bit lines, but not through the bit line pass gates 504-0, which are off (to reduce bit line length and RC charging time) during the above-mentioned read operation from the source block 551 to the bottom DDC 502-0B. At this point, Page 0 data is located in the top DDC 502-0T and Page 1 data is located in the bottom DDC 502-0B.

At step 5, Page 0 data is programmed (e.g., written) from the top DDC 502-0T to the target block 550 (e.g., Page 0 of the target block). Substantially concurrently with this programming operation, Page 1 data is output from the bottom DDC 502-0B (e.g., to perform any error-checking and data scrubbing techniques) as indicated at 553 for step 5, and input back to the bottom DDC 502-0B as indicated at 554 for step 5. No data is communicated through the bit line pass gates 504-0 during either of the above-mentioned operations of step 5, so the bit line pass gates 504-0 are controlled to interrupt respective bit lines while the Page 0 data is being programmed to the target block 540 to obtain the performance improvements associated with reducing the length of the bit lines, thereby reducing the corresponding RC characteristics to reduce bit line charging time.

The bit line pass gates are then closed, and at step 6 the Page 1 data is transferred from the bottom DDC 502-0B to the top DDC 502-0T, as indicated at 555 for step 6. At step 7, page 2 data is read from the source block 551 to the bottom DDC 502-0B as indicated at 552 for step 7. As was described for the Page 0 and Page 1 data, the Page 2 data is communicated through the bit line portions on one side of the bit line pass gates 504-0, which can therefore be off to obtain the beneficial performance of shorter bit lines previously described. At this point, Page 1 data is located in the top DDC 502-0T and Page 2 data is located in the bottom DDC 502-0B. Again, the above-described cyclical process to move pages of data continues until all pages have been moved from the source block 551 to the target block 550.

Figure 5C:
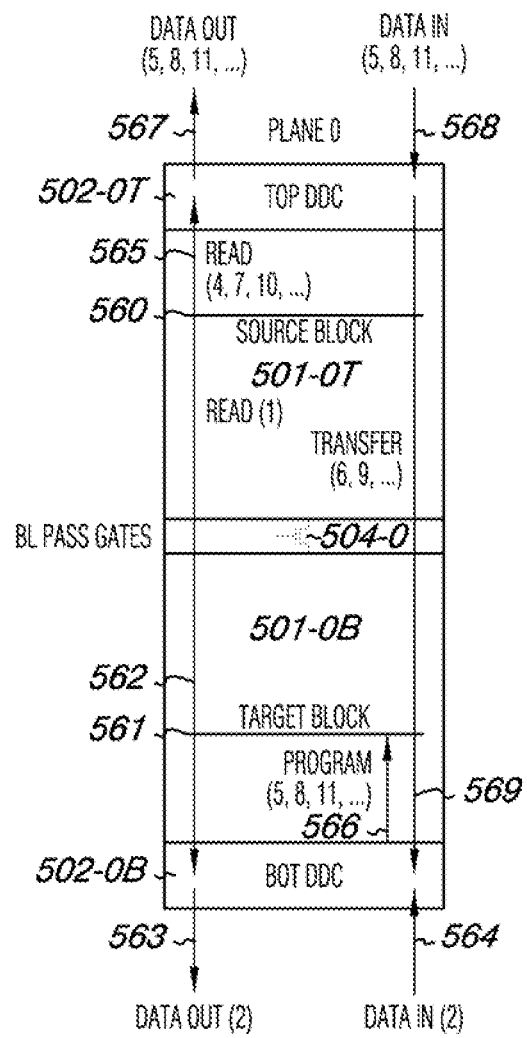
FIG. 5C illustrates a block diagram of an enhanced block copy from a top portion of a plane to a bottom portion of the plane in accordance with one or more embodiments of the present disclosure.

FIG. 5C illustrates a block diagram of an enhanced block copy from a top portion of a plane to a bottom portion of the plane in accordance with one or more embodiments of the present disclosure, where the source block 560 is located in the top portion 501-0T of plane 0 and the target block 561 is located in the bottom portion 501-0B of plane 0. The reader will appreciate from the discussions of FIGS. 5A and 5B, that data from the source block was initially (e.g., at step 1) moved to the bottom DDC 502-0B. And because the target block was located in the top portion 501-0T of Plane one for the block copy operations described with respect to FIGS. 5A and 5B, each page of data was subsequently transferred from the bottom DDC 502-0B to the top DDC 502-0T before being programmed to the target block (located in the memory portion adjacent the top DDC (e.g., the top portion 501-0T of Plane 0).

In the scenario shown in FIG. 5C, the source block 560 is located in the top portion 501-0T of Plane 0, and the target block 561 is located in the bottom portion 501-0B of Plane 0. According to one or more embodiments of the present disclosure, one skilled in the art after reading the present disclosure with respect to FIG. 5B will understand that a data flow similar to that described with respect to FIG. 5B, but in an opposite direction (e.g., read from the source block 560 to the top DDC 502-0T, subsequently transferred to the bottom DDC 502-0B, and programmed to the target block 561) can be implemented. The discussion that follows describes an operation that initially reads data from the source block to the bottom DDC, whether the source block is located in the bottom 501-0B or the top 501-0T portion of Plane 0.

According to one or more embodiments of the present disclosure, first (e.g., step 1), page 0 data is read from the source block 560 to the bottom DDC 502-0B as indicated at 562 for step 1. Similar to that described for FIG. 5A, the Page 0 data is communicated through the bit line pass gates 504-0 on the bit lines, so the bit line pass gates 504-0 are closed to enable such communication during this read operation. The advantage of always initially reading the first page of data (e.g., Page 0) to the same DDC (e.g., the bottom DDC 502-0B) is that it avoids having to delay the initial read operation to decide which DDC to send it to first. As one skilled in the art will appreciate, reading the first page of data to a different DDC than to which the balance of pages will be read to, does not create any adverse data flow conflicts, as will be evident by the remainder of the discussion with respect to FIG. 5C.

Next (e.g., step 2), the Page 0 data is output from the bottom DDC 502-0B (e.g., to perform any error-checking and data scrubbing techniques) as indicated at 563, and input back to the bottom DDC 502-0B as indicated at 564. As the Page 0 data is now already located in the DDC associated with the portion of Plane 0 in which the target block 561 is located (e.g., the bottom portion 501-0B in this instance), a step (e.g., step 3), to transfer the Page 0 data to the bottom DDC 502-0B, is not utilized (note the transfer operation indicated at 569 does not include a step 3).

At step 4, page 1 data is read from the source block 560, this time to the top DDC 502-0T as indicated at 565 for step 4. Since the Page 1 data is not communicated through the bit line pass gates 504-0, they are off (e.g., open) to reduce bit line length and RC charging time. At this point, Page 0 data is still located in the bottom DDC 502-0B, and Page 1 data is located in the top DDC 502-0T.

At step 5, Page 0 data is programmed (e.g., written) from the bottom DDC 502-0B to the target block 561 (e.g., Page 0 of the target block). Substantially concurrently with this programming operation, Page 1 data is output from the top DDC 502-0T (e.g., to perform any error-checking and data scrubbing techniques) as indicated at 567 for step 5, and input back to the top DDC 502-0T as indicated at 568 for step 5. No data is communicated through the bit line pass gates 504-0 during either of the above-mentioned operations of step 5, so the bit line pass gates 504-0 are controlled to interrupt respective bit lines (e.g., be open, off) while the Page 0 data is being programmed to the target block 561 to obtain the performance improvements associated with reduced bit line length.

The bit line pass gates are then closed, and at step 6 the Page 1 data is transferred from the top DDC 502-0T to the bottom DDC 502-0B, as indicated at 569 for step 6. At step 7, page 2 data is read from the source block 560 to the top DDC 502-0T as indicated at 565 for step 7. As was described for the Page 0 and Page 1 data, the Page 2 data is communicated through the portions of bit lines on one side of the bit line pass gates 504-0, which can therefore be off to obtain the beneficial performance of shorter bit lines, as described herein. At this point, Page 1 data is located in the bottom DDC 502-0B, and Page 2 data is located in the top DDC 502-0T. The above-described cyclical process to move pages of data continues until all pages have been moved from the source block 560 to the target block 561.

Figure 5D:
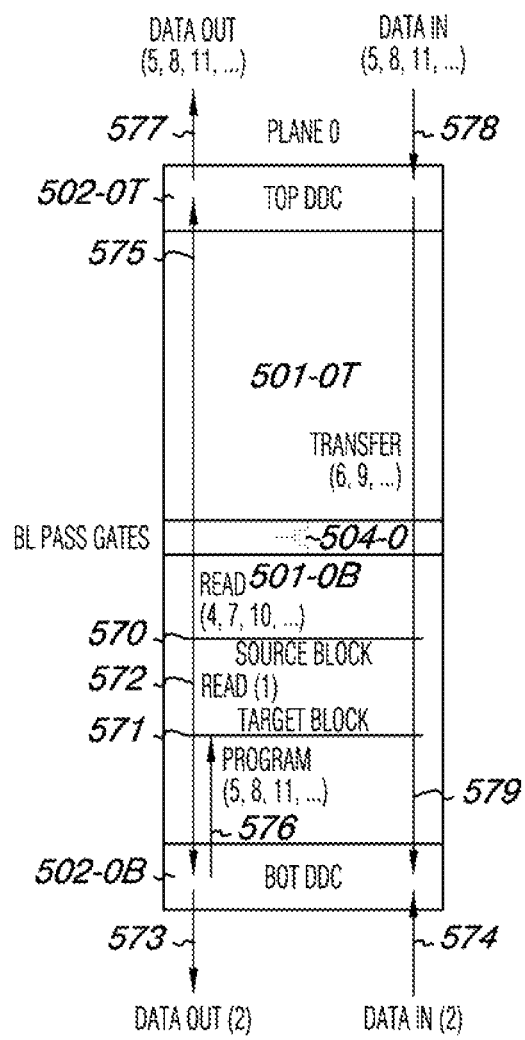
FIG. 5D illustrates a block diagram of an enhanced block copy from a bottom portion of a plane to the bottom portion of the plane in accordance with one or more embodiments of the present disclosure.

FIG. 5D illustrates a block diagram of an enhanced block copy in accordance with one or more embodiments of the present disclosure, where both the source block 570 and the target block 571 are located in the bottom portion 501-0B of plane 0. The reader will appreciate from the discussions of Figured 5A-5C, that data from the source block may initially (e.g., at step 1) be moved to the bottom DDC 502-0B. According to one or more embodiments of the present disclosure, one skilled in the art after reading the present disclosure with respect to FIG. 5A will understand that a data flow similar to that described with respect to FIG. 5A, but in an opposite direction (e.g., read from the source block 570 to the top DDC 502-0T, subsequently transferred to the bottom DDC 502-0B, and programmed to the target block 571) can be implemented. However, the discussion that follows describes an operation that initially reads data from the source block 570 to the bottom DDC 502-0B, despite the location of the source block and/or the target block.

According to one or more embodiments of the present disclosure, first (e.g., step 1), page 0 data is read from the source block 570 to the bottom DDC 502-0B as indicated at 572 for step 1. As the Page 0 data does not need to be communicated through the bit line pass gates 504-0 on the bit lines, the bit line pass gates 504-0 can be open to reduce the bit line length and obtain the associated benefits therewith. As mentioned with respect to FIG. 5C, there is some advantage to initially reading the first page of data (e.g., Page 0) to the same DDC (e.g., the bottom DDC 502-0B), which is applicable for this discussion with respect to FIG. 5D.

Next (e.g., step 2), the Page 0 data is output from the bottom DDC 502-0B (e.g., to perform any error-checking and data scrubbing techniques) as indicated at 573, and input back to the bottom DDC 502-0B as indicated at 574. As the Page 0 data is now already located in the DDC (e.g., 502-0B) associated with the portion of Plane 0 in which the target block 571 is located (e.g., the bottom portion 501-0B of Plane 0 in this instance), a step (e.g., step 3), to transfer the Page 0 data to the bottom DDC 502-0B, is not utilized (note the transfer operation indicated at 579 does not include a step 3).

At step 4, page 1 data is read from the source block 570, this time to the top DDC 502-0T as indicated at 575 for step 4. As Page 1 data is communicated through the bit line pass gates 504-0, the bit line pass gates are controlled (e.g., on, conducting) in order to facilitate this communication. At this point, Page 0 data is still located in the bottom DDC 502-0B, and Page 1 data is located in the top DDC 502-0T.

At step 5, Page 0 data is programmed (e.g., written) from the bottom DDC 502-0B to the target block 571 (e.g., Page 0 of the target block). Substantially concurrently with this programming operation, Page 1 data is output from the top DDC 502-0T (e.g., to perform any error-checking and data scrubbing techniques) as indicated at 577 for step 5, and input back to the top DDC 502-0T as indicated at 578 for step 5. No data is communicated through the bit line pass gates 504-0 during either of the above-mentioned operations of step 5, so the bit line pass gates 504-0 are controlled to interrupt respective bit lines while the Page 0 data is being programmed to the target block 571 to obtain the performance improvements associated with reduced bit line length.

The bit line pass gates are then closed, and at step 6 the Page 1 data is transferred from the top DDC 502-0T to the bottom DDC 502-0B, as indicated at 579 for step 6. At step 7, Page 2 data is read from the source block 570 to the top DDC 502-0T as indicated at 575 for step 7. As was described for the Page 0 and Page 1 data, the Page 2 data is communicated during step 7 by the bit lines through the bit line pass gates 504-0, which are on. At this point, Page 1 data is located in the bottom DDC 502-0B, and Page 2 data is located in the top DDC 502-0T. The above-described cyclical process to move pages of data continues until all pages have been moved from the source block 570 to the target block 571.

Figure 6:
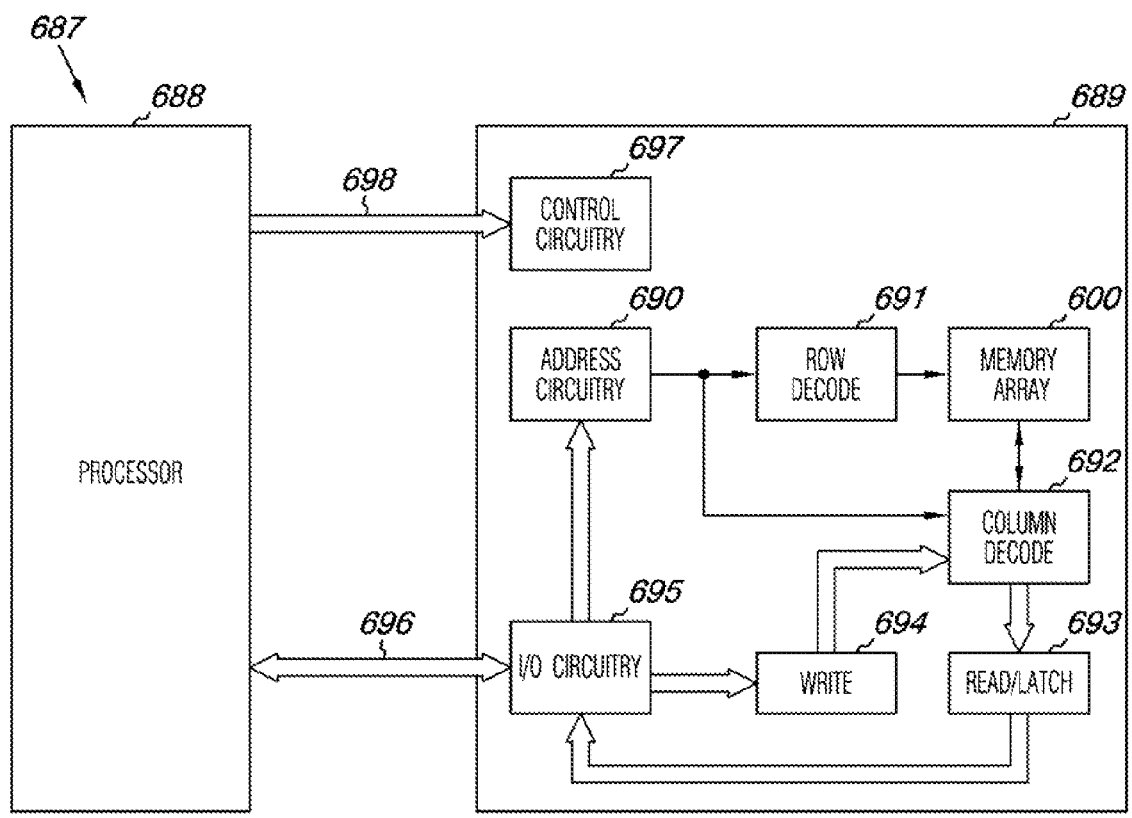
FIG. 6 is a functional block diagram of an electronic memory system having at least one memory device operated in accordance with one or more embodiments of the present disclosure.

FIG. 6 is a functional block diagram of an electronic memory system 687 having at least one memory device 689 operated in accordance with one or more embodiments of the present disclosure. Memory system 687 includes a processor 688 coupled to a non-volatile memory device 689 that includes a memory array 600 of non-volatile cells. The memory system 687 can include separate integrated circuits or both the processor 688 and the memory device 689 can be on the same integrated circuit. The processor 688 can be a microprocessor or some other type of controlling circuitry such as an application-specific integrated circuit (ASIC).

The memory device 689 includes an array of non-volatile memory cells 600, which can be floating gate flash memory cells with a NAND architecture, such as depicted in FIG. 1. The embodiment of FIG. 6 includes address circuitry 690 to latch address signals provided over I/O connections 696 through I/O circuitry 695. Address signals are received and decoded by a row decoder 691 and a column decoder 692 to access the memory array 600. In light of the present disclosure, it will be appreciated by those skilled in the art that the number of address input connections depends on the density and architecture of the memory array 600 and that the number of addresses increases with both increased numbers of memory cells and increased numbers of memory blocks and arrays.

The memory device 689 senses data in the memory array 600 by sensing voltage and/or current changes in the memory array columns using sense/buffer circuitry that in this embodiment can be read/latch circuitry 693. The read/latch circuitry 693 can read and latch a page (e.g., a row) of data from the memory array 600. I/O circuitry 695 is included for bi-directional data communication over the I/O connections 696 with the processor 688. Write circuitry 694 is included to write data to the memory array 600.

Control circuitry 697 decodes signals provided by control connections 698 from the processor 688. These signals can include chip signals, write enable signals, and address latch signals that are used to control the operations on the memory array 600, including data sensing, data write, and data erase operations. The control circuitry 697 can selectively reset particular registers and/or sections of registers according to one or more embodiments of the present disclosure. In one or more embodiments, the control circuitry 697 is responsible for executing instructions from the processor 688 to perform the operations according to embodiments of the present disclosure. The control circuitry 697 can be a state machine, a sequencer, or some other type of controller. It will be appreciated by those skilled in the art that additional circuitry and control signals can be provided, and that the memory device detail of FIG. 6 has been reduced to facilitate ease of illustration.

CONCLUSION

The present disclosure includes methods and apparatus for an enhanced block copy. One embodiment includes reading data from a source block located in a first portion of the memory device, and programming the data to a target block located in a second portion of the memory device. The first and second portions are communicatively coupled by data lines extending across the portions. The data lines are communicatively uncoupled between the first and second portions for at least one of the reading and programming acts.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
   a first plane of memory cells having:
      a first portion and an associated register; and
      a second portion and an associated different register; and
   a number of switching devices each configured to interrupt a corresponding bit line extending across the first portion and the second portion, wherein the number of switching devices are configured to enable transferring data stored in the first portion to the different register.

2. The memory device of claim 1, wherein the register and the different register are a dynamic data cache (DDC).

3. The memory device of claim 1, wherein the first plane has two portions.

4. The memory device of claim 3, further comprising control circuitry communicatively coupled to the number of switching devices, and configured to operate the number of switching devices to interrupt corresponding bit lines during programming operations from the different register to a target block during a block copy operation.

5. The memory device of claim 4, wherein the control circuitry is further configured to operate the number of switching devices to interrupt the corresponding bit lines during reading operations of a block copy when a source block and target block are located in different portions.

6. The memory device of claim 4, wherein the control circuitry is further configured to operate the number of switching devices to not interrupt the corresponding bit lines during operations transferring data between the register and the different register associated with the first portion and the second portion.

7. The memory device of claim 3, further comprising
a second plane of memory cells having a plurality of portions, each portion having a register associated therewith;
a second number of switching devices configured to each interrupt a bit line extending across at least two of the plurality of portions.

8. The memory device of claim 7, wherein the control circuitry is further configured to operate the second number of switching devices to interrupt corresponding bit lines such that the memory device can be operated as a quad plane memory device.

9. The memory device of claim 1, wherein each of the register and the different register is located proximate to its respective associated portion.

10. A memory device, comprising:
a first portion of memory cells having a first register associated therewith;
a second portion of memory cells having a second register associated therewith; and
a number of bit lines communicatively coupled to the first and second portions through a number of switching devices, each of the switching devices being configured to selectively interrupt a corresponding one of the number of bit lines between the first and the second portions;
wherein the number of switching devices are configured to enable transferring of data stored in the first portion of memory cells to the second register.

11. The memory device of claim 10, further comprising control circuitry, the control circuitry being configured to cause the number of switching devices to interrupt a respective corresponding one of a number of bit lines between the first and second portions while moving data between a particular one of the portions and the register associated therewith.

12. The memory device of claim 10, further comprising control circuitry, the control circuitry being configured to cause the number of switching devices to communicatively couple a respective corresponding one of a number of bit lines between the first and second portions while moving data between a particular one of the portions and the register not associated therewith.

13. The memory device of claim 10, further comprising control circuitry, the control circuitry being configured to cause the number of switching devices to communicatively couple a respective corresponding one of a number of bit lines between the first and second portions while moving data between the first and the second register.

14. The memory device of claim 10, further comprising control circuitry, the control circuitry being configured to cause the number of switching devices to selectively interrupt the number of bit lines between the first and second portions so as to operate the first and the second portions independent from one another.

15. The memory device of claim 14, wherein the control circuitry is further configured to cause the number of switching devices to selectively communicatively couple the number of bit lines between the first and second portions so as to operate the first and the second portions as one portion.

16. A memory device, comprising:
a first portion of a plane of the memory device having:
a first portion of a bit line extending across the first portion of the plane; and
an associated register;
a second portion of the plane of the memory device having:
a second portion of the bit line extending across the second portion of the plane; and
an associated different register; and
a first switching device coupled between the first portion and the second portion of the bit line,
wherein the first switching device is operable to communicatively uncouple the first portion of the bit line from the second portion of the bit line for at least one of data being read from a source block located in the first portion of the plane and data being programmed to a target block located in the second portion of the plane; and
wherein the first switching device is operable to enable transferring data associated with the first portion to the different register.

17. The memory device of claim 16, wherein the switching device is selected from a group comprising a transistor, a 1:1 multiplexor, and a pass gate.

18. The memory device of claim 16, further comprising:
a third portion of the plane of the memory device having a third portion of the bit line extending across the second portion of the plane; and
a second switching device coupled between the second portion of the bit line and the third portion of the bit line,
wherein the second switching device is operable to communicatively uncouple the second portion of the bit line from the third portion of the bit line for at least one of a read operation and a program operation.

19. The memory device of claim 16, wherein the first portion of the plane and the second portion of the plane are not equal portions of the plane.

* * * * *